(12) United States Patent
Chinen (10) Patent No.: US 11,508,995 B2
(45) Date of Patent: Nov. 22, 2022

(54) BATTERY DEVICE, BATTERY MANAGEMENT DEVICE, ELECTRONIC DEVICE, ELECTRIC MOTOR VEHICLE, POWER STORAGE DEVICE, AND POWER SYSTEM

(71) Applicant: MURATA MANUFACTURING CO., LTD., Kyoto (JP)

(72) Inventor: Atsushi Chinen, Kyoto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 586 days.

(21) Appl. No.: 16/563,003

(22) Filed: Sep. 6, 2019

(65) Prior Publication Data
US 2019/0393563 A1    Dec. 26, 2019

Related U.S. Application Data

(63) Continuation of application No. PCT/JP2017/040591, filed on Nov. 10, 2017.

(30) Foreign Application Priority Data

Mar. 10, 2017    (JP) .............................. JP2017-045817

(51) Int. Cl.
H01M 10/42    (2006.01)
B60L 58/10    (2019.01)
H02J 7/00    (2006.01)

(52) U.S. Cl.
CPC ......... H01M 10/4257 (2013.01); B60L 58/10 (2019.02); H02J 7/0013 (2013.01); H01M 2010/4271 (2013.01)

(58) Field of Classification Search
CPC ......... H01M 2010/4271; H01M 10/44; H01M 10/48; H01M 10/4257; H01M 10/486;
(Continued)

(56) References Cited

U.S. PATENT DOCUMENTS

2007/0210755 A1    9/2007    Gangstoe et al.
2012/0089286 A1*   4/2012    Nakata .................... B60L 58/20
                                                              701/22

FOREIGN PATENT DOCUMENTS

JP    H09289734 A    11/1997
JP    2005026732 A   1/2005
(Continued)

OTHER PUBLICATIONS

International Search Report for Application No. PCT/JP2017/040591, dated Jan. 30, 2018.

*Primary Examiner* — Anthony R Jimenez
(74) *Attorney, Agent, or Firm* — K&L Gates LLP (57) ABSTRACT

A battery device includes a battery unit which has a plurality of batteries connected in series; first and second lines each led from a cathode and an anode of the battery unit; first and second semiconductor switch elements which are inserted into the first line; a driver configured to generate a drive signal to turn off one of the first and second semiconductor switch elements when a protective operation is performed; a third semiconductor switch element which is inserted between a gate of at least one of the first and second semiconductor switch elements and an intermediate voltage point of the battery unit; and a semiconductor switch controller including a detector configured to turn on the third semiconductor switch element when the drive signal is detected and to apply a potential smaller than a source potential to a gate of one of the first.

12 Claims, 10 Drawing Sheets

(58) Field of Classification Search
CPC ......... H01M 10/4271; H01M 10/4278; H01M 10/443; H01M 10/60; H01M 10/61; H01M 10/625; H01M 10/63; H01M 10/633; H01M 10/637; H01M 10/65; H01M 2220/00; H01M 2220/20; H01M 2/20; H01M 2/202; H01M 2/204; H01M 2/206; H01M 2/208; H01M 2/22; H01M 2/24; H01M 2/26; H01M 2/38; H01M 10/42; H02J 7/00; H02J 7/0013; H02J 7/0014; H02J 7/0016; H02J 7/0019; H02J 7/0021; H02J 7/0024; H02J 7/0026; H02J 7/0047; B60L 58/00; B60L 58/10; B60L 58/14; B60L 58/18; B60L 58/19; B60L 58/20; B60L 58/21; B60L 58/25
USPC .......................................................... 429/61
See application file for complete search history.

(56) References Cited

FOREIGN PATENT DOCUMENTS

| | | |
|---|---|---|
| JP | 2005027365 A | 1/2005 |
| JP | 2008029067 A | 2/2008 |
| JP | 2009529766 A | 8/2009 |

\* cited by examiner

BATTERY DEVICE, BATTERY MANAGEMENT DEVICE, ELECTRONIC DEVICE, ELECTRIC MOTOR VEHICLE, POWER STORAGE DEVICE, AND POWER SYSTEM

CROSS REFERENCE TO RELATED APPLICATIONS

The present application is a continuation of PCT patent application no. PCT/JP2017/040591, filed on Nov. 10, 2017, which claims priority to Japanese patent application no. JP2017-045817 filed on Mar. 10, 2017, the entire contents of which are being incorporated herein by reference.

BACKGROUND

The present technology generally relates to, for example, a battery device, a battery management device, an electronic device, an electric motor vehicle, and a power storage system using a lithium ion secondary battery.

There has been known a battery pack which incorporates a battery unit including a plurality of batteries connected in series, a metal oxide semiconductor (MOS) field effect transistor (FET) for charging (hereinafter, referred to as a charge FET) that is connected to the battery unit in series and turns on/off a charge current of the battery unit, a MOSFET for discharging (hereinafter, referred to as a discharge FET) that turns on/off a discharge current of the battery unit, and a protective circuit that controls the charge FET and the discharge FET. The protective circuit turns off a charge path to the battery unit by the charge FET at the time of detecting overcharging, and turns off a discharge path of the battery unit by discharge FET at the time of detecting overdischarging.

SUMMARY

A conventional circuit configuration has two problems. First, in a case where the battery pack in which a plurality of battery cells are connected in series employs the conventional circuit configuration, a large negative voltage is applied to the gate of the discharge FET when the discharge FET is turned off. Since an electric tool, an electric motorcycle or the like requires a relatively high voltage, an output voltage of the battery pack also becomes high. For example, in FIG. 1, since 10 battery cells are connected in series, in the case of a lithium ion battery having a full charge voltage of 4.2 V, the gate voltage becomes −42 V at the moment when the discharge FET is turned off at full charge. Therefore, it is necessary to adopt an FET having a large gate withstand voltage. Actually, the gate withstand voltage of the FET is usually ±25 to 30 V, which decreases the selection range of components.

The second problem is that a resistance value between a drain and a source of the discharge FET gradually increases from a start of an operation of turning off the discharge FET until the discharge FET is turned off. At this time, since a source terminal voltage of the FET approaches a battery negative voltage due to a voltage division through drain-source resistance and load resistance, a voltage difference between the gate and source of the FET becomes smaller after the start of the cutoff operation, so a cutoff time is extended.

Therefore, the present technology provides a battery device, a battery management device, an electronic device, an electric motor vehicle, a power storage device, and a power system which do not have the above problems.

According to an embodiment of the present disclosure, a battery device is provided. The battery device includes:

a battery unit including a plurality of batteries connected in series;

first and second lines each led from a cathode and an anode of the battery unit;

first and second semiconductor switch elements which are inserted into the first line;

a driver configured to generate a drive signal to turn off one of the first and second semiconductor switch elements when a protective operation is performed;

a third semiconductor switch element which is inserted between a gate of at least one of the first and second semiconductor switch elements and an intermediate voltage point of the battery unit; and a semiconductor switch controller including a detector configured to turn on the third semiconductor switch element when the drive signal is detected and to apply a potential smaller than a source potential to a gate of one of the first and second semiconductor switch elements from the intermediate voltage point via the third semiconductor switch element.

According to an embodiment of the present disclosure, a battery management device is provided. The battery management device includes first and second lines each led from a cathode and an anode of a battery unit including a plurality of batteries connected in series and first and second semiconductor switch elements both inserted into the first line;

a driver configured to generate a drive signal to turn off one of the first and second semiconductor switch elements when a protective operation is performed;

a third semiconductor switch element which is inserted between a gate of at least one of the first and second semiconductor switch elements and an intermediate voltage point of the battery unit; and a semiconductor switch controller including a detector configured to turn on the third semiconductor switch element when the drive signal is detected and to apply a potential smaller than a source potential to a gate of one of the first and second semiconductor switch elements from the intermediate voltage point via the third semiconductor switch element.

The present technology provides an electronic device which is supplied with power from the battery device as described herein.

The present technology provides an electric motor vehicle according to an embodiment of present disclosure. The electric motor vehicle includes a converter configured to be supplied with power from the battery device as described herein and convert the power into a driving force of a vehicle; and a controller configured to perform information processing on vehicle control based on information on a battery;

The present technology provides a power storage device which has the battery device as described herein and is configured to supply power to an electronic device connected to the battery device.

The present technology provides a power system which is configured to be supplied with power from the battery device as described herein.

According to at least one embodiment, since the intermediate voltage of the battery block is supplied to the gate of the semiconductor switch element, the semiconductor switch element having the low withstand voltage can be used. Further, the semiconductor switch element can be cut off at high speed.

It should be understood that the effects described herein are not necessarily limited, and other suitable properties relating to the present technology may be realized and as further described

DETAILED DESCRIPTION

As described herein, the present disclosure will be described based on examples with reference to the drawings, but the present disclosure is not to be considered limited to the examples, and various numerical values and materials in the examples are considered by way of example.

For example, a battery block (referred to as an assembled battery) BL in which ten battery cells of lithium ion secondary batteries are connected in series is provided. For example, a voltage of about 42 V can be output by the battery block BL. A power line PL1 is led from a cathode side of the battery block BL, and a power line PL2 is led from an anode side thereof. An anode terminal 101b is connected to the power line PL2. A charge FET (C-FET in FIG. 1) Qc and a discharge FET (D-FET in FIG. 1) Qd are connected to the power line PL1, and a cathode terminal 101a is connected to the discharge FET Qd. A diode 110 is connected in parallel to the charge FET Qc in forward polarity with respect to a discharge current, and a diode 111 is connected in parallel to the discharge FET Qd in forward polarity with respect to a charge current.

Figure 1:
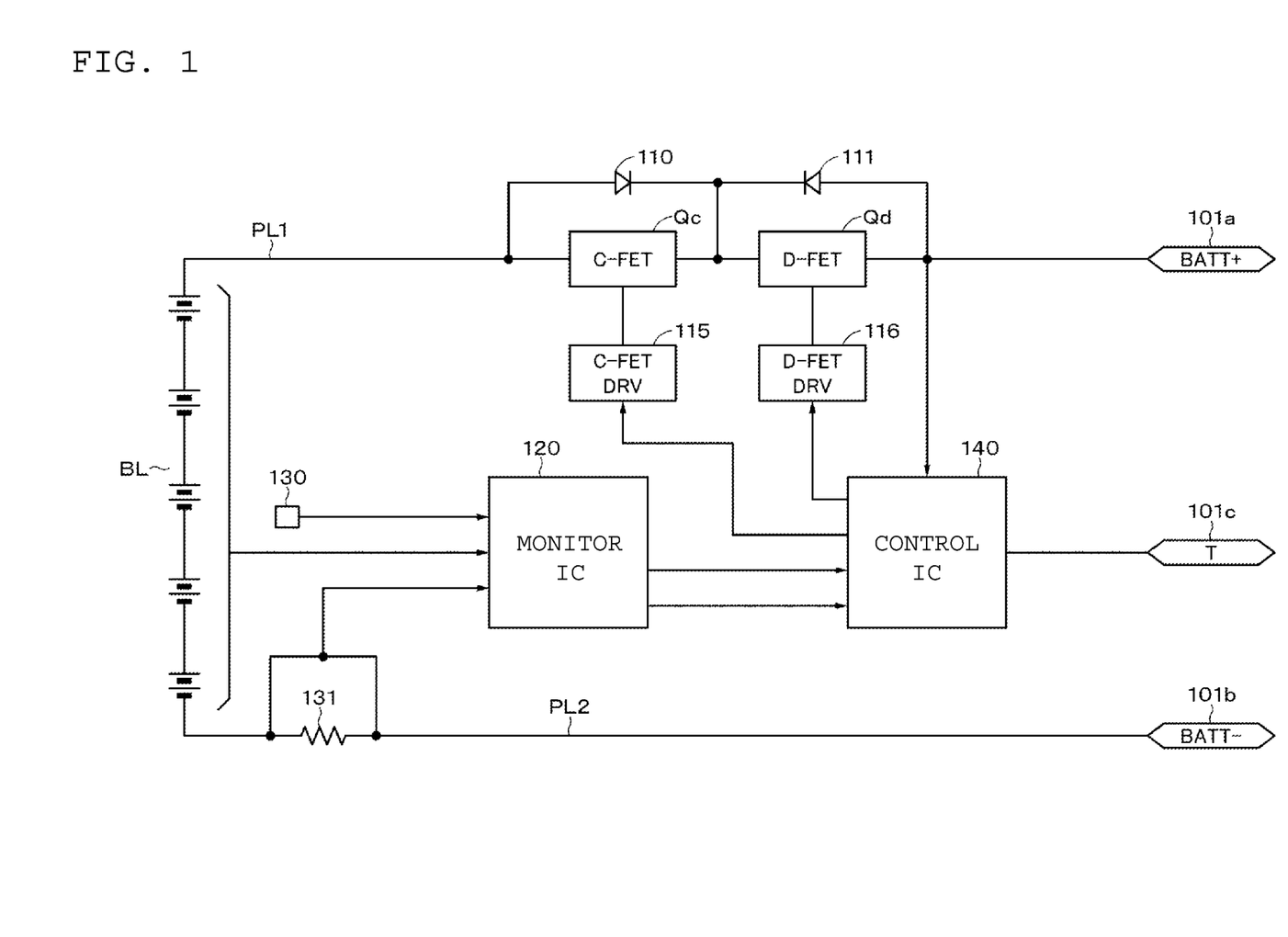
FIG. 1 is a connection diagram of an example of a battery pack to which the present technology can be applied.

A monitor integrated circuit (IC) 120 is provided, and the monitor IC 120 monitors a voltage of each battery cell of the battery block BL, a temperature of each battery cell detected by a temperature sensor 130, and a current detected by a detection resistor 131. A detection output of the monitor IC 120 is supplied to a control IC 140. The control IC 140 monitors an output voltage. In addition, the control IC 140 controls the charge FET Qc to be turned on/off via a charge FET driver 115, and controls the discharge FET Qd to be turned on/off via a discharge FET driver 116. Note that the monitor IC 120 and the control IC 140 may be integrally configured.

The control IC 140 is configured by, for example, a micro-processing unit (MPU). The control IC 140 communicates with external devices such as a load or a host controller via a communication terminal 101c. Communication can use arbitrary communication standards such as a standard of a controller area network (CAN). In addition, the communication may be wired or wireless. The control IC 140 digitizes and transmits voltage information, temperature information, current information, and the like of the battery block BL by the above-described communication.

In the normal operation, both the charge FET Qc and the discharge FET Qd are in a turn-on state. At the time of charging, a charge circuit is connected to the cathode terminal 101a and the anode terminal 101b, and the battery block BL is charged. At the time of discharging, a load is connected to the cathode terminal 101a and the anode terminal 101b. Here, when overcharging is detected, the charge FET Qc is turned off, and the supply of the charge current to the battery block BL is blocked. In addition, when the overdischarging or an overcurrent is detected, the discharge FET Qd is turned off to block the discharge current from flowing.

Figure 2:
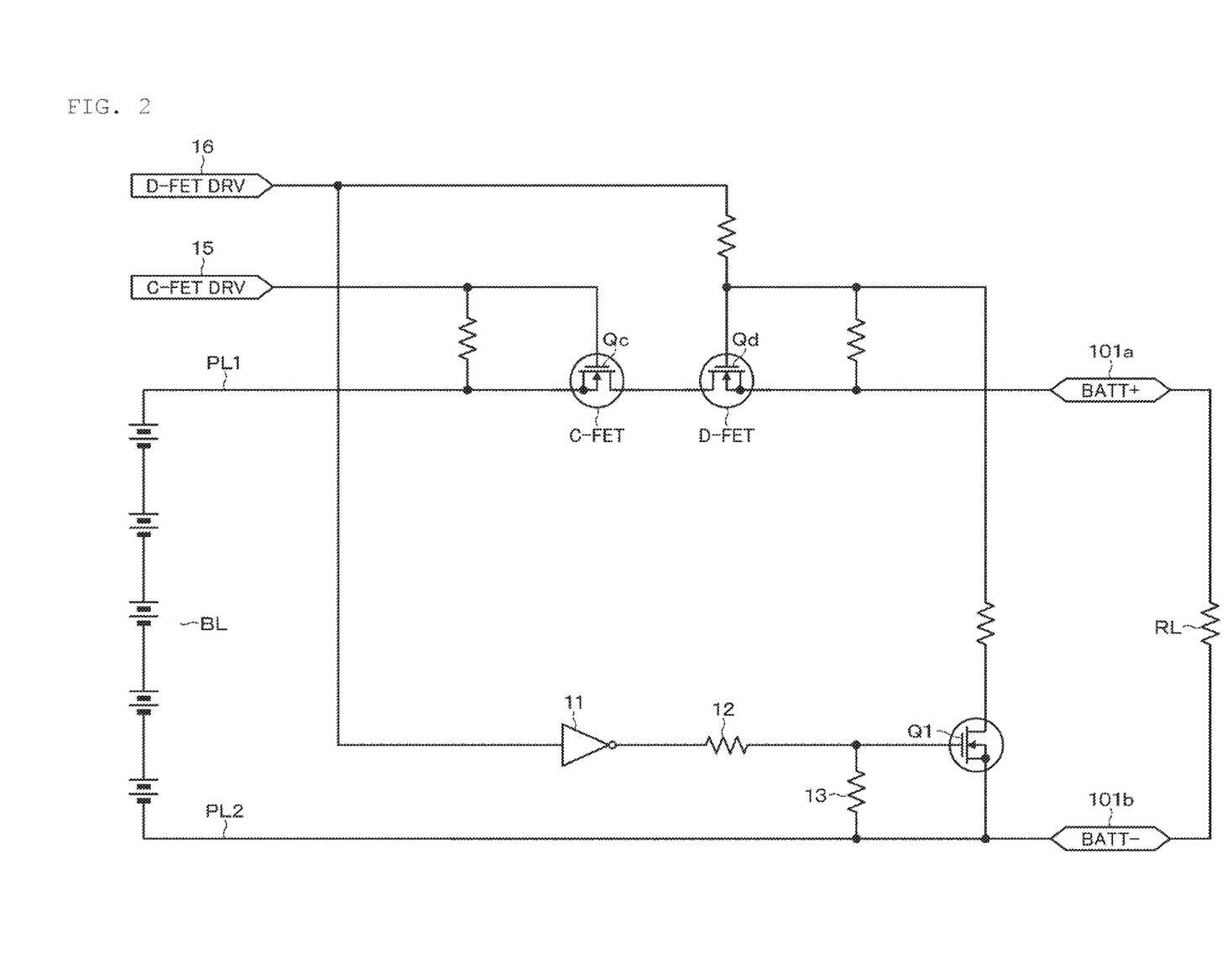
FIG. 2 is a connection diagram showing a configuration of a conventional battery pack.

FIG. 2 shows a specific circuit configuration around the conventional charge FET Qc and the discharge FET Qd. A diode connected in parallel to each FET is omitted. The charge FET Qc and the discharge FET Qd are an N-channel type. Drains of the charge FET Qc and the discharge FET Qd are connected to each other in common, a drive signal is supplied from the charge FET driver 115 to the gate of the charge FET Qc via the terminal 15, and the drive signal is supplied from the discharge FET driver 116 to the gate of the discharge FET Qd via a terminal 16. A load resistor RL is connected to the cathode terminal 101a and the anode terminal 101b.

A control signal from the discharge FET driver 116 is supplied to a gate of an N-channel MOSFET Q1 via an inverter 11 and a resistor 12. A resistor 13 is connected between the gate and the power line PL2 on the anode side of the battery block BL. When the discharge FET Qd is turned off, the control signal from the discharge FET driver 116 turns on the MOSFET Q1. As a result, the gate of the discharge FET Qd is lowered to a negative potential of the power line PL2, and the discharge FET Qd is turned off.

In such a conventional configuration, as described above, a voltage (for example, 42 V) between the cathode and anode of the battery block BL is applied between the gate and the source of the discharge FET Qd. A withstand voltage between the gate and the source is usually about 25 to 30 V, which causes a problem that elements selectable as the discharge FET Qd are limited.

The second problem is that a resistance value between a drain and a source of the discharge FET gradually increases from a start of an operation of turning off the discharge FET until the discharge FET is turned off. At this time, since a source terminal voltage of the FET approaches a battery negative voltage due to a voltage division through drain-source resistance and load resistance, a voltage difference between the gate and source of the FET becomes smaller after the start of the cutoff operation, so a cutoff time is extended.

The importance of cutting off the discharge FET at high speed will be described.

Effect of Drain Current Amount by Turn on/Off Speed of MOSFET

In general, a current flowing in the MOSFET is defined by Id (max) of a specification. However, when a drain current is turned on/off by the gate terminal of the MOSFET, the drain current is required within an area of safe operation (ASO) defined on the specification of the MOSFET. The safe operation area defines a current which can be turned on and a current which can be turned off according to a "drain-source voltage" and a "On transition time/OFF transition time". In general, the shorter of the transition time of OFF→ON/ON→OFF can handle a large drain current, and it is necessary to operate the gate terminal of the MOSFET at high speed in order to make the transition time of OFF→ON/ON→OFF short. When the transition time of OFF→ON/ON→OFF cannot be shortened, it is necessary to connect the FETs in parallel and keep the amount of current per FET within the area of safe operation.

Figure 3:
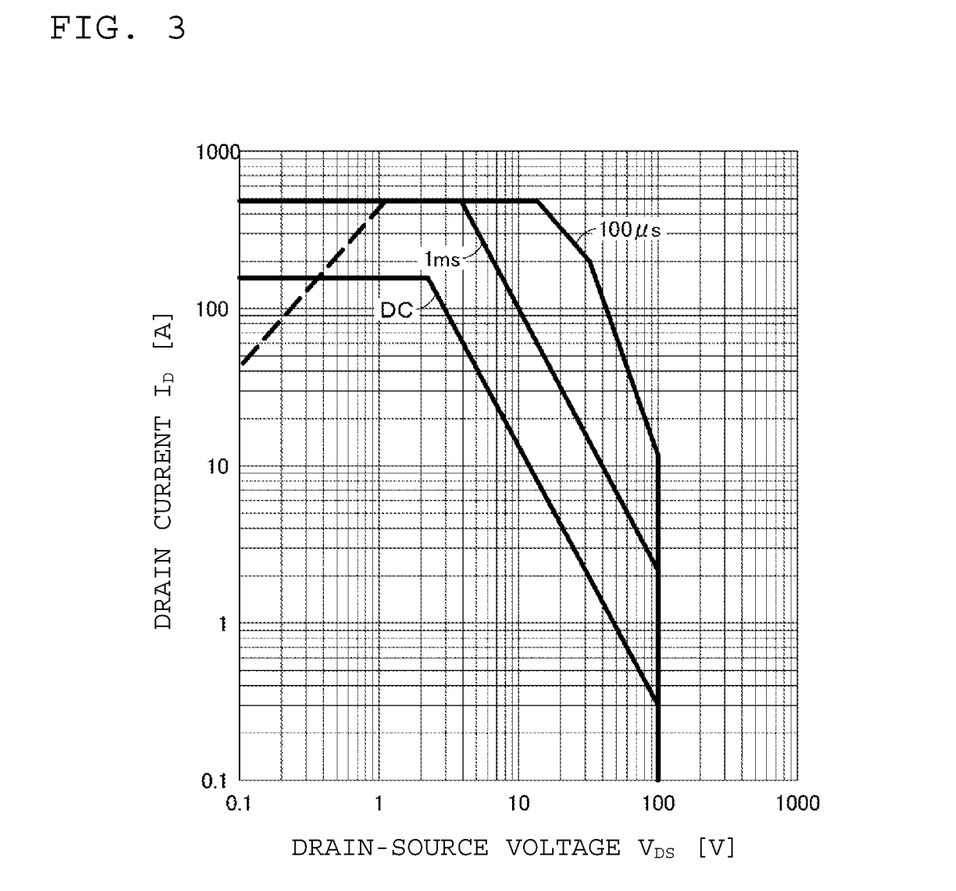
FIG. 3 is a graph for describing an area of safe operation (ASO) of a FET.

FIG. 3 shows an example (MOSFET TK 160F10N manufactured by Toshiba Corporation) of an area of safe operation (ASO) of FET (Q1). A horizontal axis indicates a drain-source voltage $V_{DS}$, and a vertical axis indicates a drain current $I_D$. The area of safe operation (ASO) is obtained for each width (transition time) of a single pulse. A range inside each line in FIG. 3 is the area of safe operation (ASO). If the transition time is within 100 μsec, the drain current can be handled up to 100 Å at $V_{DS}$=40 V, but if the transition time is delayed to 1 msec, the drain current which can be handled even at the same $V_{DS}$=40 V is restricted to about 10 Å.

The MOSFET used in the battery pack is used as a protective element which performs stop of charging and stop of discharging. That is, the MOSFET is normally used in the turn-on state and turned off when abnormality occurs. In particular, a function of cutting off an abnormal large current occurring due to an external short circuit or the like is important. In order to cut off a large current, it is necessary to connect many MOSFETs in parallel in consideration of the area of safe operation. However, in consideration of the above-described area of safe operation, "a high speed cutoff of MOSFET (short transition time) increases a current which can be handled per MOSFET" is realized, which is effective in reducing the number of paralleled MOSFETs.

1. Due to the restrictions of the area of safe operation, the MOSFET can decrease a current which flows in the drain if the transition time of ON/OFF is delayed.

2. Since the FET in the battery pack is installed for protection, the transition of ON→OFF becomes more important than the transition of OFF→ON. (The transition time of ON may be slower than the transition time of OFF.)

3. Since the shortening of the cutoff time of the FET means that the current which flows in each FET increases, there is an effect of cost down which can decrease the number of FETs connected in parallel.

Figure 4:
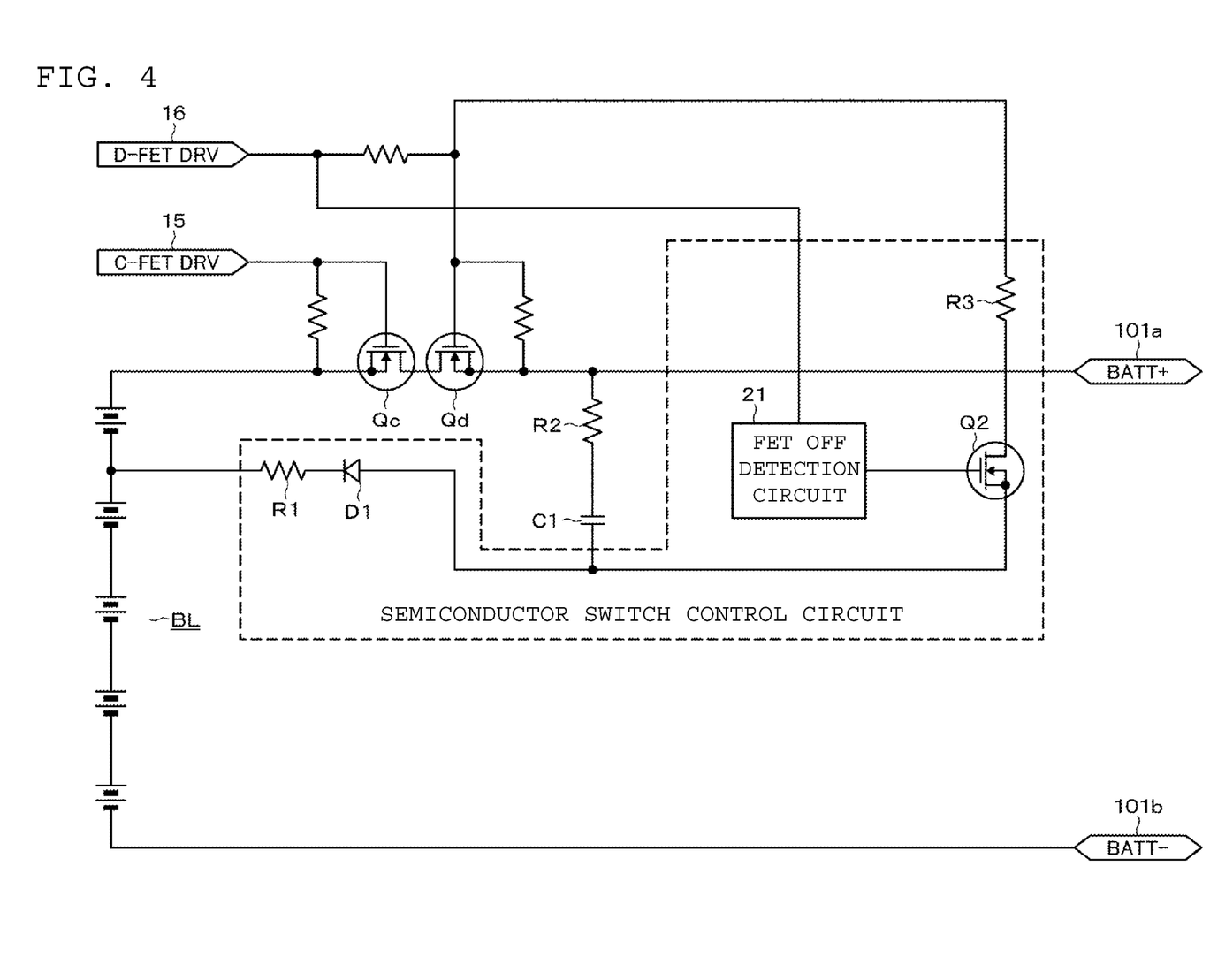
FIG. 4 is a block diagram of a battery pack according to an embodiment of the present technology.
Figure 5:
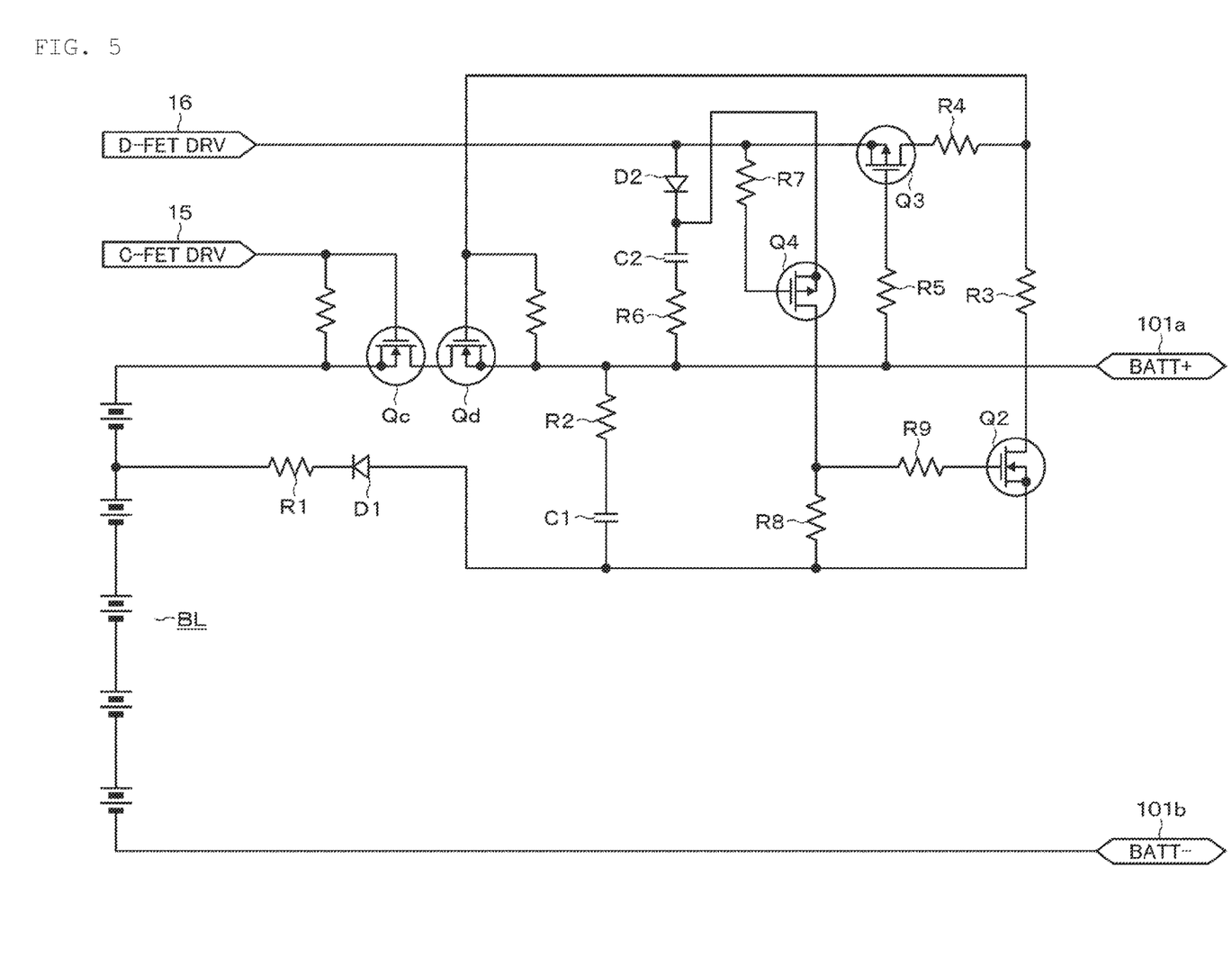
FIG. 5 is a connection diagram of the battery pack according to an embodiment of the present technology.
Figure 6A:
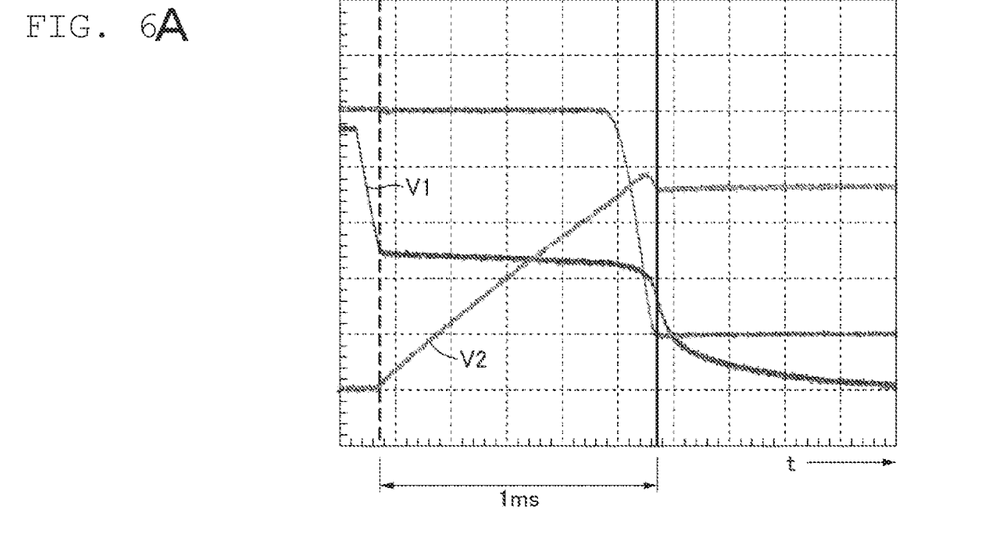
FIGS. 6A and 6B are waveform charts of each unit at the time of cutoff of the conventional battery pack and an embodiment of the present disclosure.

A first embodiment of the present technology will be described with reference to FIGS. 4, 5 and 6. FIG. 4 is a block diagram of the first embodiment, and FIG. 5 is a circuit diagram showing a specific connection. The drive signal is supplied from the charge FET driver 115 to the gate of the charge FET Qc as the first semiconductor switch element via the terminal 15, so the charge FET Qc is turned on/off. The drive signal is supplied from the discharge FET driver 116 to the gate of the discharge FET Qd as the second semiconductor switch element via the terminal 16, so the discharge FET Qd is turned on/off.

A drain of an N-channel MOSFET Q2 as a third semiconductor switch element is connected to the gate of the discharge FET Qd via a resistor R3. A source of the MOSFET Q2 is connected to an anode of a diode D1, and a cathode of the diode D1 is connected to an intermediate voltage point of the battery block BL via the resistor R1. Here, the intermediate voltage point is a connection point where a voltage lower than the voltage of the entire battery block BL is generated, and means a connection point of the cathode side of the number (1, 2, . . . , or (N−1)) counted from the anode side of the battery block BL when the number of battery blocks connected in series is N. For example, the cathode of the diode D1 is connected via the resistor R1 to a point of potential as low as two battery cells (for example, 8.4 V) with respect to the cathode side of the battery block BL. Note that the battery block BL is not limited to the series configuration of battery cells, and the configuration in which a plurality of battery cells, for example, two battery cells are connected in parallel may be the configuration in which the plurality of battery cells may be connected in series.

A detection signal is output from the FET OFF detection circuit 21 to the gate of the MOSFET Q2. The drive signal of the discharge FET driver is supplied from the terminal 16 to the FET OFF detection circuit 21. Furthermore, a series circuit of a resistor R2 and a capacitor C1 is connected between the source of the discharge FET Qd and the source of the MOSFET Q2. The FET OFF detection circuit 21 described above, the MOSFET Q2, the resistor R3, the diode D1, and the resistor R1 constitute a semiconductor switch control circuit, as indicated by a dashed line.

A specific example of the FET OFF detection circuit 21 is shown in FIG. 5. A source and a drain of a P-channel MOSFET Q3 and a resistor R4 are connected between the terminal 16 to which the drive signal from the discharge FET driver is supplied and the gate of the discharge FET Qd. The gate of the MOSFET Q3 is connected to a cathode side terminal 101a via a resistor R5.

The terminal 16 to which the drive signal from the discharge FET driver is supplied is connected to an anode of a diode D2, and a cathode of the diode D2 is connected to the cathode side terminal 101a via a capacitor C2 and a resistor R6. A connection point between the cathode of the diode D2 and the capacitor C2 is connected to a drain of a P-channel MOSFET Q4. A gate of the MOSFET Q4 is connected via the resistor R7 to the terminal 16 to which drive signal from the discharge FET driver is supplied. The drain of the MOSFET Q4 is connected to the source of the MOSFET Q2 via a resistor R8. A connection point between the drain of the MOSFET Q4 and the resistor R8 is connected to the gate of the MOSFET Q2 via a resistor R9.

The above-described first embodiment can solve the two problems (a gate negative voltage is reduced after the application of a negative voltage exceeding a gate withstand voltage and the start of the cutoff of FET) of the prior art. That is, 1) By using the intermediate voltage of the battery block BL including multiple serial battery cells and generating a negative voltage for high speed cutoff, it is possible to generate a gate cutoff negative voltage within a range not exceeding the gate withstand voltage of the discharge FET Qd.

2) The gate cutoff negative voltage generated in this way is stored in the capacitor C1, or by a function of reverse flow prevention of the diode D1, the negative voltage for the cathode side terminal 101a is held until the charge of the capacitor C1 is used up even if the cathode side terminal voltage decreases. As a result, even when the cathode side terminal 101a is at the same potential as that of an anode side terminal 101*b*, the negative voltage for cutting off the FET can be secured, and the discharge FET Qd can be reliably cut off.

Furthermore, although the intermediate voltage is used as an additional effect other than these effects, since an amount of discharge from the battery is not greater than an amount of charges stored in the capacitor, a factor causing a cell balance to be disturbed can be suppressed to the minimum even if the intermediate voltage is used.

The operation of the above-described first embodiment (configuration of FIG. 4) will be described in order. Usually, the charge FET Qc and the discharge FET Qd are turned on.

1) When a drive signal of a gate ON voltage is supplied from the discharge FET driver to the terminal 16, the discharge FET Qd is turned on. When the discharge FET Qd is turned on, the supply of power from the cathode side terminal 101*a* and the anode side terminal 101*b* to the load is started. The capacitor C1 is charged in parallel. The capacitor C1 is charged to an intermediate voltage (for two battery cells).

2) In this state, when the drive signal from the discharge FET driver becomes an OFF voltage, the discharge FET OFF detection circuit 21 detects the OFF voltage and turns on the MOSFET Q2.

3) The MOSFET Q2 is in a turn-on state, and connected to the gate terminal of the discharge FET and the capacitor C1. Since the capacitor C1 holds the negative voltage up to the intermediate voltage in the state of sequence 1), the negative voltage is supplied between the gate and the source of the discharge FET Qd to rapidly pull out the charge of the gate of the discharge FET Qd. At this time, the drain-source resistance of the discharge FET Qd transitioning from ON to OFF gradually increases, and thus the source side voltage of the discharge FET Qd gradually decreases, but the potential across the capacitor C1 blocks the charge from the battery block BL from decreasing due to the function of the diode D1. That is, when a load connection state continues after the discharge FET Qd is turned off, the capacitor C1 is blocked from being charged with the voltage from the anode terminal 101*b* to the intermediate voltage.

4) The gate voltage of the discharge FET Qd decreases, the discharge FET Qd is turned off, and the supply of power from the cathode side terminal 101*a* and the anode side terminal 101*b* to the load is stopped.

The specific circuit configuration shown in FIG. 5 performs the same operation as described above. The configuration of FIG. 5 will be described. A series circuit of the diode D2, the capacitor C2 and the resistor R6 is connected between the terminal 16 to which the drive signal is supplied and the cathode side terminal 101*a*. The connection point of the cathode of the diode D2 and the capacitor C2 is connected to the gate of the MOSFET Q2 via the source and drain of the P-channel MOSFET Q4.

Since the voltage of the drive signal is held in the capacitor C2, when the drive signal is stopped, the MOSFET Q4 is turned on.

After the MOSFET Q4 is turned on, a voltage for turning on the MOSFET Q2 is supplied via the MOSFET Q4. In this way, the diode D2, the capacitor C2, the resistors R6, R7, R8 and R9, and the MOSFET Q4 constitute the discharge FET OFF detection circuit 21 in FIG. 4.

Furthermore, in the specific configuration of FIG. 5, the MOSFET Q3, the resistor R4, and the resistor R3 are connected between the supply terminal 16 of the drive signal and the drain of the MOSFET Q2, and the resistor R5 is inserted between the gate of the MOSFET Q3 and the cathode side terminal 101*a*. The MOSFET Q3 is provided when the supply terminal 16 of the drive signal cannot withstand an input equal to or less than the voltage of the cathode side terminal 101*a*.

The configuration of the conventional configuration shown in FIG. 2 will be described in comparison with the configuration of the first embodiment of the present technology with reference to FIGS. 6A and 6B. FIG. 6A is waveform charts of each unit of the conventional configuration. A voltage waveform V1 is a gate voltage waveform of the discharge FET Qd. A voltage waveform V2 is a voltage waveform between the drain and the source of the discharge FET Qd. It takes about 1 msec for the voltage between the drain and the source to rise, that is, for the discharge FET Qd to be cut off.

Figure 6B:
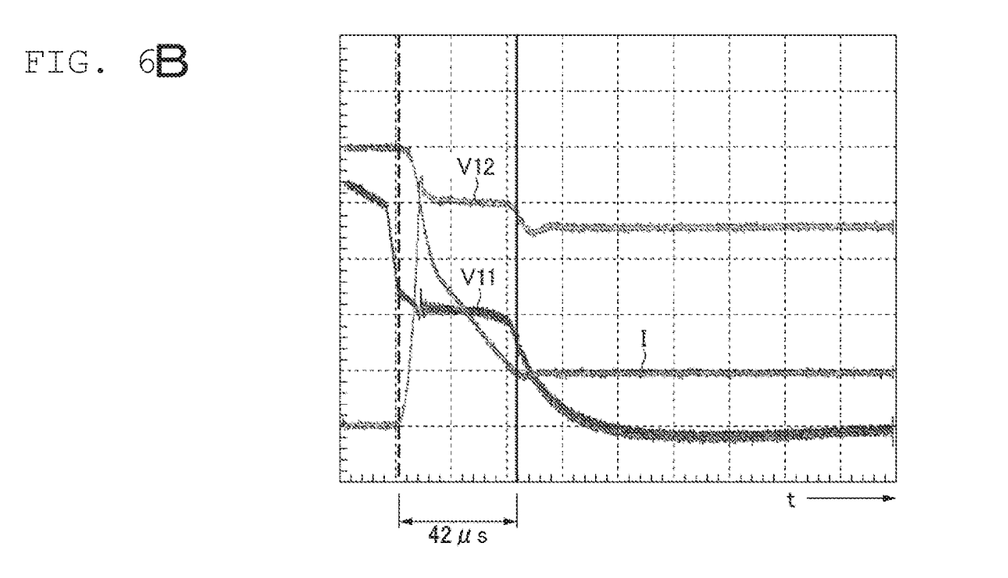

FIG. 6B is waveform charts of each unit according to the first embodiment of the present technology. A voltage waveform V11 is a gate voltage waveform of the discharge FET Qd, and a voltage waveform V12 is a voltage waveform between the drain and the source of the discharge FET Qd. A current waveform I is a drain current waveform of the discharge FET Qd. The time until the drain-source voltage rises and the drain current falls, that is, the time when the discharge FET Qd is cut off is about 42 μsec. Therefore, the cutoff time can be approximately ($\frac{1}{24}$) as compared with the conventional configuration.

The first embodiment of the present technology described above has the following effects.

The discharge FET Qd can be cut off at high speed.

By utilizing the intermediate voltage of the batteries having the series configuration, the gate voltage of the discharge FET can be suppressed from being within the withstand voltage even in multiple series batteries configuration. When a similar circuit is realized without using the intermediate voltage, a separate power supply or a voltage dividing resistor is required, which increases a circuit loss.

Even in the case of a short circuit through a low resistance conductor such as a wiring material, a negative potential can be applied to the gate terminal at the time of cutoff by the function of the capacitor C1 and the diode D1.

Figure 7:
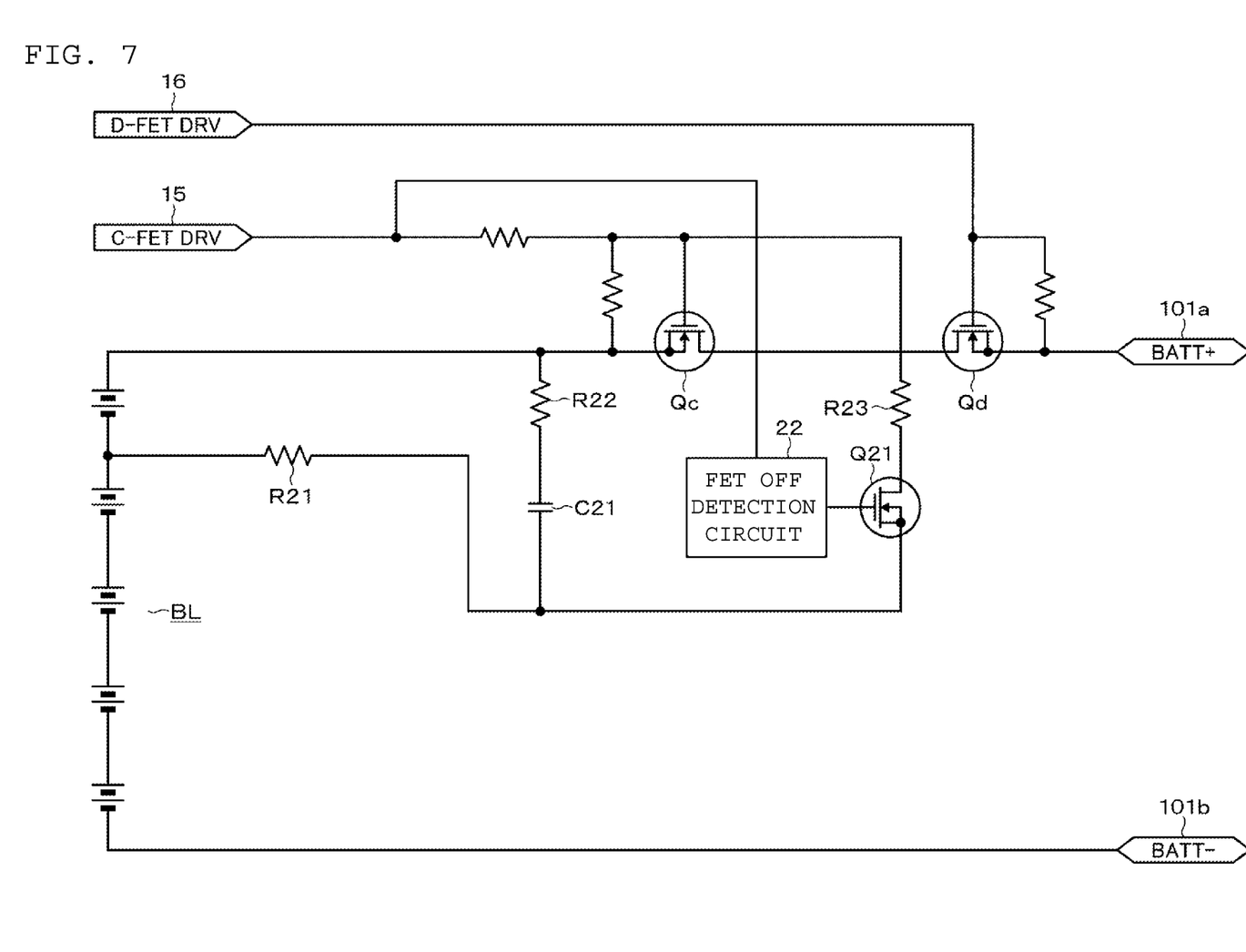
FIG. 7 is a block diagram of a battery pack according to an embodiment of the present technology.

A second embodiment of the present technology will be described with reference to FIG. 7. In the second embodiment, a charge FET Qc is cut off at high speed. A gate of the charge FET Qc is connected to a drain of a MOSFET Q21 via a resistor R23. An intermediate voltage (for example, a point at which a potential is lower by an amount of two battery cells from a potential on a cathode side) of a battery block BL is supplied to a source of the MOSFET Q21 via a resistor R21. In addition, a series circuit of a resistor R22 and a capacitor C21 is inserted into a cathode side terminal of the battery block BL and a point of the intermediate voltage.

Further, a FET OFF detection circuit 22 is connected to a terminal 15 to which a drive signal is supplied, and an output of the FET OFF detection circuit 22 is supplied to a gate of the MOSFET Q21. The FET OFF detection circuit 22 generates a single output which turns on the MOSFET Q21 only when the charge FET Qc is cut off. If the FET OFF detection circuit 22 always turns on the MOSFET Q21, a problem occurs in that two battery cells between the cathode side of the battery block BL and the intermediate voltage are always discharged.

In a bidirectional switch circuit configuration in which the drain side of the MOSFET is shared, a source terminal of the charge FET Qc is connected to the battery block BL. Therefore, the following problem does not occur in a discharge FET Qd.

"In the process from the start of the operation of turning off the discharge FET Qd until the discharge FET Qd is turned off, a resistance value between the drain and source of the discharge FET Qd will gradually rise. At this time, since a source terminal voltage of the discharge FET Qd approaches a battery negative voltage due to a voltage division between drain-source resistance and load resistance, a voltage difference between the gate and source of the discharge FET Qd becomes small after the start of the cutoff operation, so a cutoff time is extended."

Therefore, a change in a voltage difference between a voltage applied to the source terminal of the charging MOSFET Qc and the intermediate voltage of the battery block BL does not occur, so the capacitor C1 (first embodiment) is in principle unnecessary. However, in practice, the capacitor C1 has less restrictions in arrangement than the battery block, and wiring resistance can be reduced if the capacitor C1 is arranged close to the charge FET Qc or on the same substrate together with the MOSFET Q21. Therefore, high speed cutoff can be achieved by using the same circuit.

In the above description, the charge FET Qc and the discharge FET Qd are configured to have their drains coupled to each other. However, an actual bidirectional switch such as a MOSFET can also be configured by a connection between sources, and effectively works for a high speed cutoff circuit according to the present technology.

This is because the next problems occurring when the discharge FET Qd is OFF occur similarly when the sources are connected to each other.

"In the process from the start of the operation of turning off the discharge FET until the discharge FET is turned off, a resistance value between the drain and source of the discharge FET Qd will gradually rise. At this time, since a source terminal voltage of the FET approaches a battery negative voltage due to a voltage division between drain-source resistance and load resistance, a voltage difference between the gate and source of the FET becomes small after the start of the cutoff operation, so a cutoff time is extended."

Figure 8:
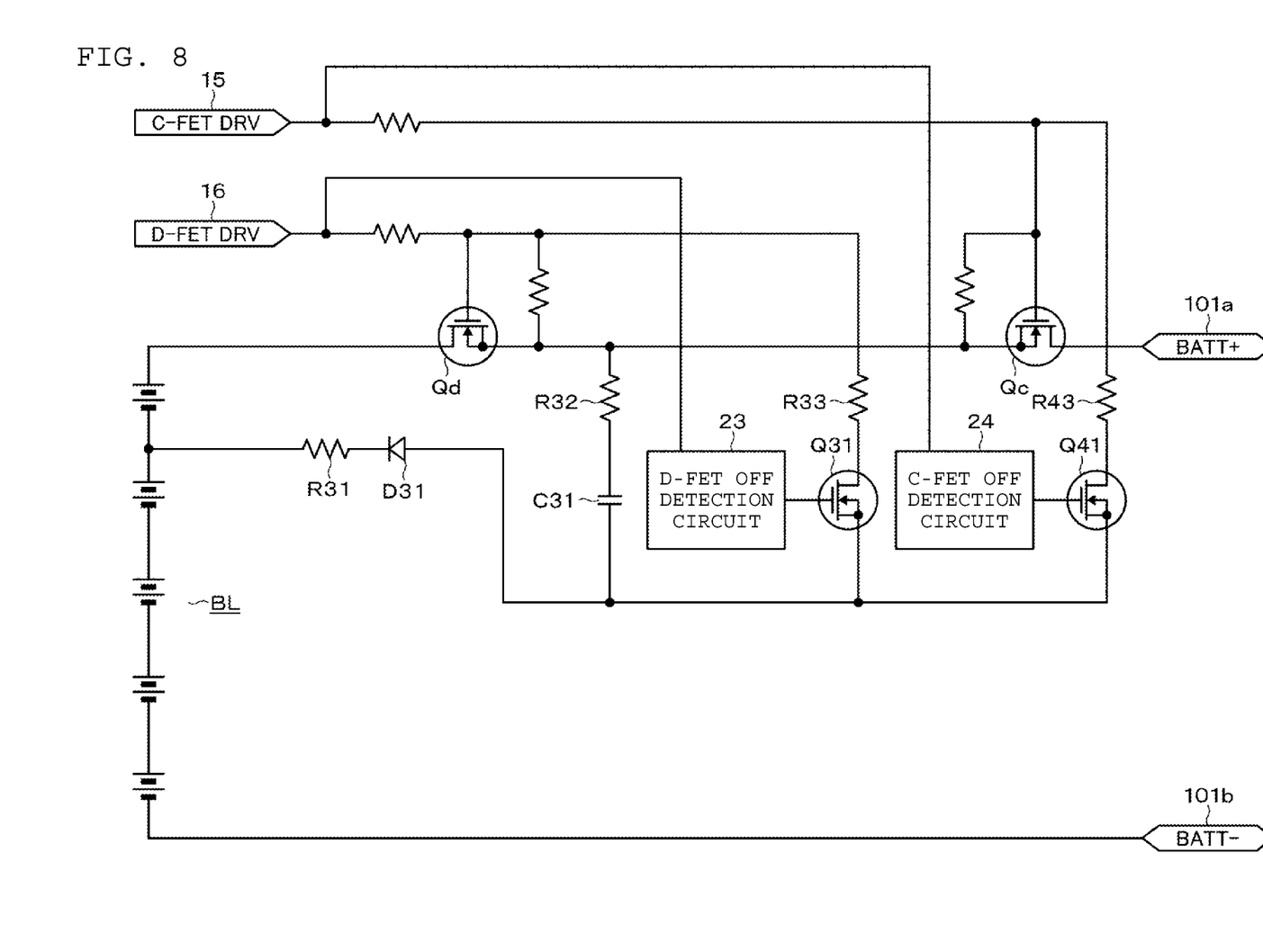
FIG. 8 is a block diagram of a battery pack according to an embodiment of the present technology.

FIG. 8 shows a configuration of a third embodiment of the present technology. A source of the discharge FET Qd and a source of the charge FET Qc are connected to each other. A drain of the discharge FET Qd is connected to a cathode side of a battery block BL. A drain of the charge FET Qc is connected to a cathode side terminal 101a. A series circuit of a resistor R32 and a capacitor C31 is inserted between a connection point of sources and an intermediate voltage point of the battery block BL.

A gate of the discharge FET Qd is connected to a drain of a MOSFET Q31 via a resistor R33. The source of the MOSFET Q31 is connected to the intermediate voltage point via a diode D31 and a resistor R31. An output signal of a discharge FET OFF detection circuit 23 is supplied to a gate of the MOSFET Q31. When a drive signal from a terminal 16 is a voltage which turns off the discharge FET Qd, the discharge FET OFF detection circuit 23 turns on the MOSFET Q31. As a result, a negative potential stored in the capacitor C31 is supplied to the gate of the discharge FET Qd, and the discharge FET Qd can be cut off at high speed.

Similar to the discharge FET Qd, a MOSFET Q41, a charge FET OFF detection circuit 24 and a resistor R43 are connected also to the charge FET Qc. Therefore, when the charge FET Qc is turned off, the negative potential stored in the capacitor C31 is supplied to the gate of the charge FET Qc, so the charge FET Qc can be cut off at high speed. In principle, when a voltage across the diode D31 is (cathode potential>anode potential), the high speed cutoff of the FET does not operate, but in this state, since charging and discharging are not performed, there is no problem.

Next, an application example of the present technology will be described.

"Storage System in Vehicle as Application Example"

Figure 9:
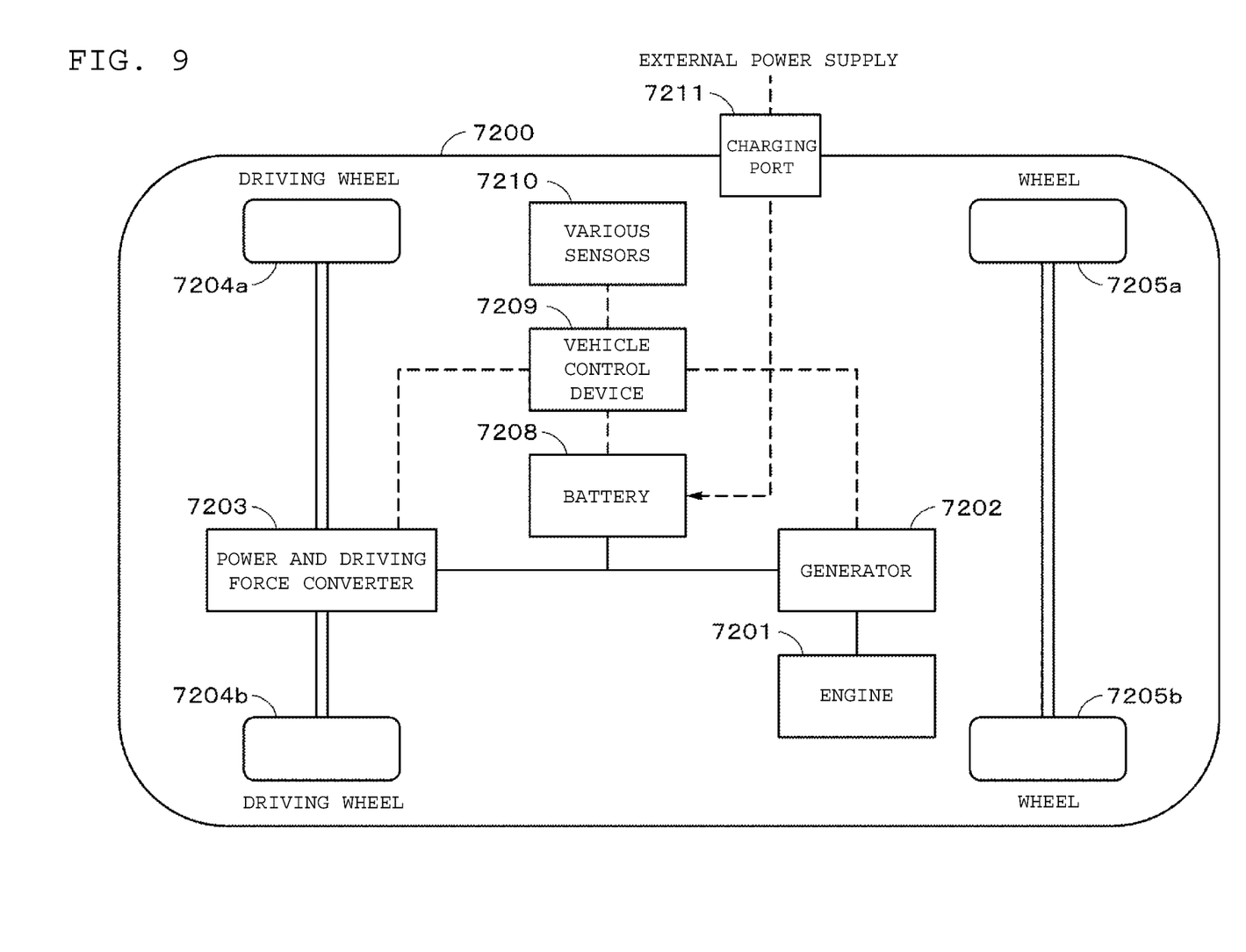
FIG. 9 is schematic diagram showing an example of a configuration of a hybrid vehicle which employs a series hybrid system to which the present technology is applied.

An example in which the present disclosure is applied to a storage system for a vehicle will be described with reference to FIG. 9. FIG. 9 schematically shows an example of a configuration of a hybrid car that employs a series hybrid system to which the present technology is applied. A series hybrid system is a vehicle which travels by a power and driving force converter which uses power generated by a generator driven by an engine or power once stored in a battery.

A hybrid car 7200 includes an engine 7201, a generator 7202, a power and driving force converter 7203, a driving wheel 7204a, a driving wheel 7204b, a wheel 7205a, a wheel 7205b, a battery 7208, a vehicle control device (controller) 7209, various sensors 7210, a charging port 7211. The battery device of the present technology described above is applied to the battery 7208.

The hybrid car 7200 travels using the power and driving force converter 7203 as a power source. An example of the power and driving force converter 7203 is a motor. The power and driving force converter 7203 is operated by the power of the battery 7208, and the rotational force of the power and driving force converter 7203 is transmitted to the driving wheels 7204a and 7204b. Note that by using direct current to alternating current (DC-AC) or reverse conversion (AC to DC conversion) at necessary places, the power and driving force converter 7203 can be applied to either an alternating current motor or a direct current motor. Various sensors 7210 control an engine speed and an opening degree (throttle opening degree) of a throttle valve (not illustrated) using the vehicle control device (controller) 7209. The controller includes a processor or the like. Various sensors 7210 include a speed sensor, an acceleration sensor, an engine speed sensor, and the like.

A rotational force of the engine 7201 is transmitted to the generator 7202, and the power generated by the generator 7202 can be stored in the battery 7208 by the rotational force.

When the hybrid car is decelerated by a braking mechanism (not shown), a resistance force at the time of deceleration is applied as a rotational force to the power and driving force converter 7203, and a regenerative power generated by the power and driving force converter 7203 is stored in battery 7208 by the rotational force.

The battery 7208 can be connected to a power supply outside the hybrid car and therefore the charging port 7211 as an input port is supplied with power from the external power supply, so the battery 7208 can store the received power.

Although not shown, an information processing apparatus performing information processing related to vehicle control based on information on a secondary battery may be provided. Examples of the information processing apparatus include an information processing apparatus which displays a battery remaining quantity based on information on a battery remaining quantity.

In the above description, the series hybrid car traveling by a motor using the power generated by the generator driven by the engine or the power once stored in the battery has been described as an example. However, the present technology can effectively be applied to a parallel hybrid car in which both the outputs of the engine and the motor are drive sources, and thus three modes of traveling the parallel hybrid car only by the engine, traveling the parallel hybrid car only by the motor, and traveling the parallel hybrid car by the engine and the motor are appropriately switched and used. Furthermore, the present technology can be effectively applied to a so-called electric motor vehicle which travels only by a drive motor without using the engine.

The example of the hybrid car 7200 to which the present technology can be applied has been described above. The present technology can be suitably applied to, for example, the vehicle control device 7209 and the battery 7208 among the configurations described above.

Figure 10:
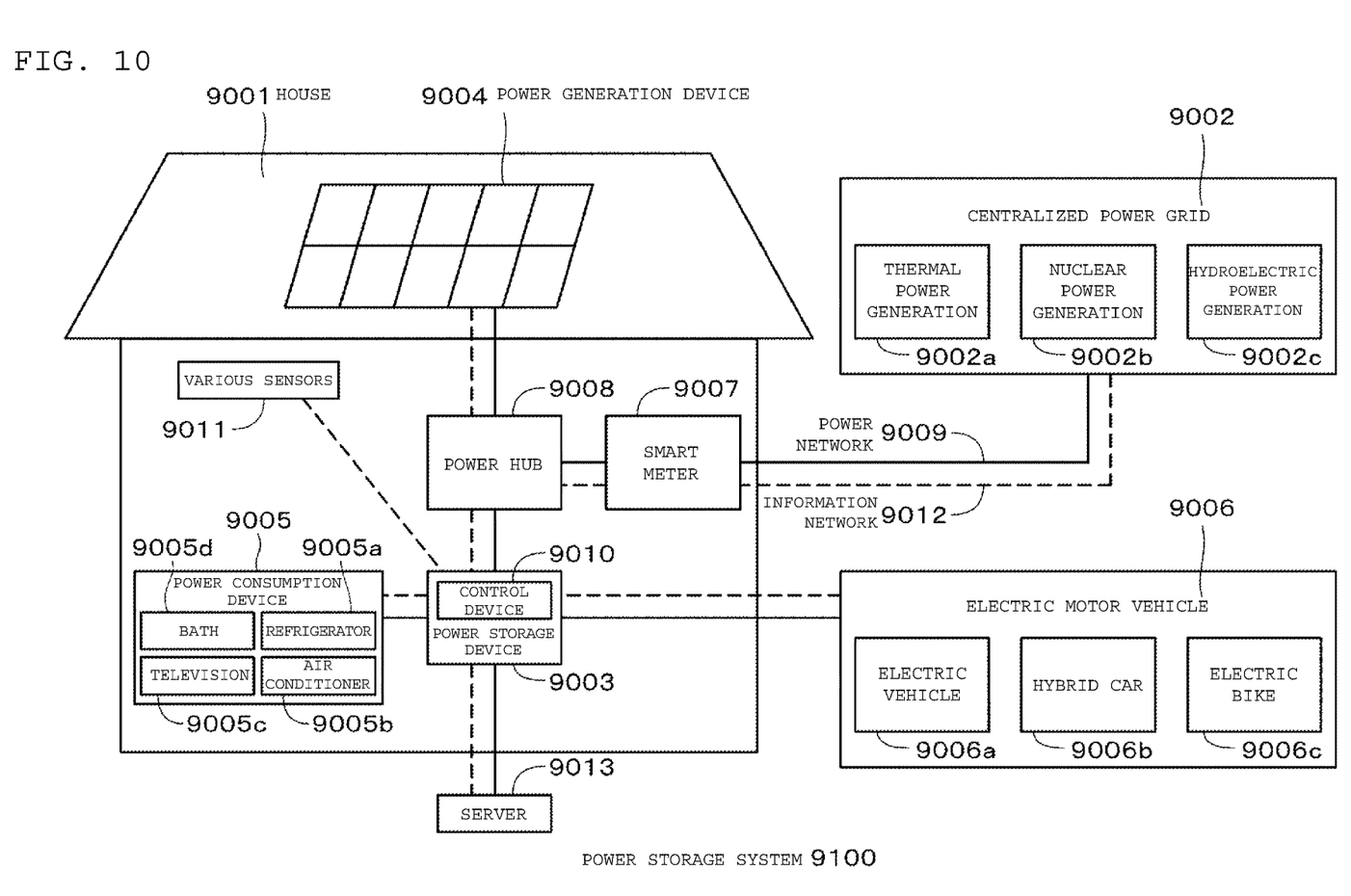
FIG. 10 is a schematic diagram showing a residential power storage system to which the present technology is applied.

An example in which the present technology is applied to a storage system for a house will be described with reference to FIG. 10. For example, in a storage system 9100 for a house 9001, power is supplied from centralized power grid 9002 such as thermal power generation 9002a, nuclear power generation 9002b, and hydroelectric power generation 9002c and the like to a power storage device 9003 via a power network 9009, an information network 9012, a smart meter 9007, a power hub 9008 and the like. At the same time, power is supplied to the power storage device 9003 from an independent power supply such as a household power generation device 9004. Power supplied to the power storage device 9003 is stored. The power storage device 9003 is used to supply power used in a house 9001. The same storage system can be used not only for the house 9001 but also for a building.

The house 9001 is provided with a power generation device 9004, a power consumption device 9005, a power storage device 9003, a control device 9010 for controlling each device, a smart meter 9007, and a sensor 9011 for acquiring various information. Each of the devices is connected to each other by a power network 9009 and an information network 9012. A solar cell, a fuel cell, or the like is used as the power generation device 9004, and the generated power is supplied to the power consumption device 9005 and/or the power storage device 9003. The power consumption device 9005 is, for example, a refrigerator 9005a, an air conditioner 9005b, a television receiver 9005c, a bath 9005d and the like. Furthermore, the power consumption device 9005 includes an electric motor vehicle 9006. The electric motor vehicle 9006 is an electric vehicle 9006a, a hybrid car 9006b, and an electric bike 9006c.

The battery unit of the present technology described above is applied to the power storage device 9003. The power storage device 9003 is constituted by a secondary battery or a capacitor. For example, the power storage device 9003 is constituted by a lithium ion battery. The lithium ion battery may be a stationary type or may be used in the electric motor vehicle 9006. The smart meter 9007 has a function of measuring a usage amount of commercial power and transmitting the measured usage amount to a power company. The power network 9009 may be one of direct current feed, alternating current feed, and non-contact feed or combinations thereof.

Various sensors 9011 are, for example, a human sensor, an illuminance sensor, an object detection sensor, a power consumption sensor, a vibration sensor, a contact sensor, a temperature sensor, an infrared sensor, and the like. Information acquired by various sensors 9011 is transmitted to the control device 9010. By the information from the sensor 9011, a state of weather, a state of a person and the like are understood, and the power consumption device 9005 can be automatically controlled to minimize energy consumption. Furthermore, the control device 9010 can transmit the information on the house 9001 to an external power company or the like via the Internet.

The power hub 9008 performs processing such as branching of power lines and DC/AC conversion. As a communication system of the information network 9012 connected to the control device 9010, there are a method of using communication interfaces such as universal asynchronous receiver-transmitter (UART), and a method of using a sensor network based on wireless communication standards such as Bluetooth (registered trademark), ZigBee (registered trademark), and Wi-Fi (registered trademark). The Bluetooth (registered trademark) system is applied to multimedia communication, and can perform one-to-many connection communication. The ZigBee (registered trademark) uses a physical layer of Institute of Electrical and Electronics Engineers (IEEE) 802.15.4. IEEE 802.15.4 is a name of a short distance wireless network standard called a personal area network (PAN) or wireless (W) PAN.

The control device 9010 is connected to an external server 9013. The server 9013 may be managed by any one of a house 9001, a power company, and a service provider. The information transmitted and received by the server 9013 is, for example, power consumption information, life pattern information, power rates, weather information, natural disaster information, and information on power transactions. These pieces of information may be transmitted and received from a household power consumption device (for example, a television receiver), but may be transmitted and received from devices (for example, a mobile phone and the like) outside the home. These pieces of information may be displayed on devices having a display function, for example, a television receiver, a mobile phone, personal digital assistants (PDA), or the like.

The control device (controller) 9010 that controls each unit is constituted by a central processing unit (CPU) or a processor, a random access memory (RAM), a read only memory (ROM), and the like, and is stored in the power storage device 9003 in this example. The control device 9010 is connected to the power storage device 9003, the household power generation device 9004, the power consumption device 9005, various sensors 9011, and the server 9013 via the information network 9012, and has a function of adjusting, for example, the usage amount of commercial power and the power generation amount. In addition, the control device 9010 may include a function, which performs transactions in an electric power market, and the like.

As described above, the power storage device 9003 may store the generated power of not only the centralized power grid 9002 such as the thermal power 9002a, the nuclear power 9002b, and the hydroelectric power 9002c but also the household power generation device 9004 (solar power generation, wind power generation). Therefore, even if the power generated by the household power generation device 9004 fluctuates, control can be performed so that the amount of power to be transmitted to the outside can be made constant, or the discharge can be performed as much as necessary. For example, a method of storing power obtained by a solar power generation in the power storage device 9003, and storing cheap off-peak electricity in night time in the power storage device 9003 and discharging electricity stored in the power storage device 9003 in the time zone of day time where an electricity charge is high can be used.

In this example, although the example in which the control device 9010 is stored in the power storage device 9003 has been described, the control device 9010 may be stored in the smart meter 9007 or may be configured alone. Furthermore, the power storage system 9100 may be used for a plurality of households in an apartment house, or may be used for a plurality of detached houses.

An example of the power storage system 9100 to which the present technology can be applied has been described above. The present technology can be suitably applied to the power storage device 9003 among the configurations described above.

The present technology is also applicable to aircraft. Since the aircraft flies above an altitude, a use environment temperature of the battery module can be equal to or less than 0° C. Such a case can be coped with by performing the above-described variable current discharge control. In addition, the present technology is applicable not only to large electric vehicles and aircraft, but also to electric motorcycles, electric bicycles, electric three-wheeled vehicles, electric small flying vehicles (also referred to as drone and the like), and the like.

In addition, the present technology is also applicable to electronic devices (PCs, smartphones, mobile phones, electric tools, toys, and the like) in which a secondary battery can be used, and can be realized as an electronic device supplied with power from the above-described battery device.

As described above, although one embodiment of the present technology was described in detail, this technology is not limited to the embodiment, but various modifications can be made based on the technical ideas of the present technology. For example, the present technology can be applied not only to the MOSFET but also to a configuration using an insulated gate bipolar transistor (IGBT) as a switch element. In addition, the configurations, methods, processes, shapes, materials, numerical values, and the like described in the embodiments described above are merely examples, and different configurations, methods, processes, shapes, materials, numerical values, and the like may be used as needed.

The present technology is described below in further detail according to an embodiment.

(1)

A battery device including:

a battery unit which has a plurality of batteries connected in series;

first and second lines which are each led from a cathode and an anode of the battery unit;

first and second semiconductor switch elements which are inserted into the first line;

a driver which generates a drive signal for turning off one of the first and second semiconductor switch elements when a protective operation is required;

a third semiconductor switch element which is inserted between a gate of at least one of the first and second semiconductor switch elements and an intermediate voltage point of the battery unit; and a semiconductor switch control circuit which has a detection circuit for turning on the third semiconductor switch element when the drive signal for turning off one of the first and second semiconductor switch elements is detected and can apply a potential smaller than a source potential to a gate of one of the first and second semiconductor switch elements from the intermediate voltage point via the third semiconductor switch element.

(2)

The battery device according to (1), including: a capacitor which is connected between an output side of one of the first and second semiconductor switch elements and the intermediate voltage point and is charged at a time of turning on one of the first and second semiconductor switch elements.

(3)

The battery device according to (1) or (2), in which a voltage value between a cathode side of the battery unit and the intermediate voltage point does not exceed a gate withstand voltage of the first and second semiconductor switch elements.

(4)

The battery device according to any one of (1) to (3), in which the third semiconductor switch element and a diode are connected between the gate of at least one of the first and second semiconductor switch elements and the intermediate voltage point of the battery unit, and a cathode of the diode is electrically connected to the intermediate voltage point.

(5)

A battery management device added to a configuration in which first and second lines are each led from a cathode and an anode of a battery unit including a plurality of batteries connected in series and first and second semiconductor switch elements are inserted into the first line, the battery management device including:

a driver which generates a drive signal for turning off one of the first and second semiconductor switch elements when a protective operation is required;

a third semiconductor switch element which is inserted between a gate of at least one of the first and second semiconductor switch elements and an intermediate voltage point of the battery unit; and a semiconductor switch control circuit which has a detection circuit for turning on the third semiconductor switch element when the drive signal for turning off one of the first and second semiconductor switch elements is detected and can apply a potential smaller than a source potential to a gate of one of the first and second semiconductor switch elements from the intermediate voltage point via the third semiconductor switch element.

(6)

The battery management device according to (5), further including a capacitor which is connected between an output side of one of the first and second semiconductor switch elements and the intermediate voltage point and is charged at the time of turning on one of the first and second semiconductor switch elements.

(7)

An electronic device supplied with power from the battery device according to (1).

(8)

An electric motor vehicle, including:

a conversion device which is supplied with power from the battery device according to (1) and converts the power into a driving force of a vehicle; and a control device which performs information processing on vehicle control based on information on a battery device.

(9)

A power storage device including the battery device according to (1), in which power is supplied to an electronic device connected to the battery device.

(10)

The power storage device according to (9), including a power information control device which transmits and receives a signal to and from other devices via a network, in which charge and discharge control of the battery device is performed based on information received by the power information control device.

(11)

A power system supplied with power from the battery device according to (1).

(12) The power system according to (11), in which the power is supplied to the battery device from a power generation device or a power network.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A battery device comprising:
   a battery unit including a plurality of batteries connected in series;
   first and second lines each provided from a cathode and an anode of the battery unit;
   first and second semiconductor switch elements which are inserted into the first line;
   a driver configured to generate a drive signal to turn off one of the first and second semiconductor switch elements when a protective operation is performed;
   a third semiconductor switch element which is inserted between a gate of at least one of the first and second semiconductor switch elements and an intermediate voltage point of the battery unit; and
   a semiconductor switch controller including a detector configured to turn on the third semiconductor switch element when the drive signal is detected and to apply a potential smaller than a source potential to the gate of at least one of the first and second semiconductor switch elements from the intermediate voltage point via the third semiconductor switch element.

2. The battery device according to claim 1, further comprising a capacitor which is connected between an output side of one of the first and second semiconductor switch elements and the intermediate voltage point and is charged at a time of turning on one of the first and second semiconductor switch elements.

3. The battery device according to claim 1, wherein a voltage value between a cathode side of the battery unit and the intermediate voltage point does not exceed a gate withstand voltage of the first and second semiconductor switch elements.

4. The battery device according to claim 1, wherein the third semiconductor switch element and a diode are connected between the gate of at least one of the first and second semiconductor switch elements and the intermediate voltage point of the battery unit, and a cathode of the diode is electrically connected to the intermediate voltage point.

5. An electronic device supplied with power from the battery device according to claim 1.

6. An electric motor vehicle, comprising:
   a converter configured to be supplied with power from the battery device according to claim 1 and convert the power into a driving force of the electric motor vehicle; and
   a controller configured to perform information processing on vehicle control based on information on the battery device.

7. A power storage device comprising the battery device according to claim 1,
   wherein the power storage device is configured to supply power to an electronic device.

8. The power storage device according to claim 7, further comprising a power information control device configured to transmit and receive a signal to and from other devices via a network,
   wherein charge and discharge control of the battery device is performed based on information received by the power information control device.

9. A power system configured to be supplied with power from the battery device according to claim 1.

10. The power system according to claim 9, wherein the power is supplied to the battery device from a power generation device or a power network.

11. A battery management device, comprising:
    first and second lines each provided from a cathode and an anode of a battery unit including a plurality of batteries connected in series; first and second semiconductor switch elements both inserted into the first line;
    a driver configured to generate a drive signal to turn off one of the first and second semiconductor switch elements when a protective operation is performed;
    a third semiconductor switch element which is inserted between a gate of at least one of the first and second semiconductor switch elements and an intermediate voltage point of the battery unit; and
    a semiconductor switch controller including a detector configured to turn on the third semiconductor switch element when the drive signal is detected and to apply a potential smaller than a source potential to the gate of at least one of the first and second semiconductor switch elements from the intermediate voltage point via the third semiconductor switch element.

12. The battery management device according to claim 11, further comprising a capacitor which is connected between an output side of one of the first and second semiconductor switch elements and the intermediate voltage point and is charged at a time of turning on one of the first and second semiconductor switch elements.

* * * * *